(12) United States Patent
Noguchi et al.

(10) Patent No.: US 10,066,317 B2
(45) Date of Patent: Sep. 4, 2018

(54) METHOD FOR MANUFACTURING A SINGLE CRYSTAL DIAMOND

(71) Applicants: NATIONAL INSTITUTE OF ADVANCED INDUSTRIAL SCIENCE AND TECHNOLOGY, Tokyo (JP); SHIN-ETSU CHEMICAL CO., LTD., Tokyo (JP)

(72) Inventors: Hitoshi Noguchi, Takasaki (JP); Daisuke Takeuchi, Tsukuba (JP); Satoshi Yamasaki, Tsukuba (JP); Masahiko Ogura, Tsukuba (JP); Hiromitsu Kato, Tsukuba (JP); Toshiharu Makino, Tsukuba (JP); Hideyo Okushi, Tsukuba (JP)

(73) Assignees: NATIONAL INSTITUTE OF ADVANCED INDUSTRIAL SCIENCE AND TECHNOLOGY, Tokyo (JP); SHIN-ETSU CHEMICAL CO., LTD., Tokyo (JP)

( * ) Notice: Subject to any disclaimer, the term of this patent is extended or adjusted under 35 U.S.C. 154(b) by 569 days.

(21) Appl. No.: 14/488,629

(22) Filed: Sep. 17, 2014

(65) Prior Publication Data
US 2015/0075420 A1 Mar. 19, 2015

(30) Foreign Application Priority Data
Sep. 19, 2013 (JP) .................................. 2013-194539

(51) Int. Cl.
*C30B 25/16* (2006.01)
*C30B 25/18* (2006.01)
(Continued)

(52) U.S. Cl.
CPC ............ *C30B 25/16* (2013.01); *C30B 25/105* (2013.01); *C30B 25/12* (2013.01); *C30B 25/18* (2013.01);
(Continued)

(58) Field of Classification Search
CPC ....... C30B 25/105; C30B 25/12; C30B 25/16; C30B 25/18; C30B 25/183; C30B 25/186; C30B 29/04
See application file for complete search history.

(56) References Cited

U.S. PATENT DOCUMENTS 5,200,231 A * 4/1993 Bachmann .............. C23C 16/27
423/446
5,500,077 A * 3/1996 Nishibayashi .......... C30B 33/00
216/38
(Continued)

FOREIGN PATENT DOCUMENTS

EP 0 666 338 A1 8/1995
EP 0 918 100 A1 5/1999
(Continued)

OTHER PUBLICATIONS

Apr. 1, 2016 Office Action issued in European Patent Application No. 14 003 205.3.
(Continued)

*Primary Examiner* — Hua Qi
(74) *Attorney, Agent, or Firm* — Oliff PLC

(57) ABSTRACT

A method for manufacturing a single crystal diamond in which vapor phase synthetic single crystal diamond is additionally deposited on a single crystal diamond seed substrate obtained by vapor phase synthesis, includes a step of measuring flatness of the seed substrate, a step of determining whether or not to flatten the seed substrate based on the measurement result of the flatness, and any one of the
(Continued)

following two steps of a step of additionally depositing the vapor phase synthetic single crystal diamond after flattening the seed substrate for which the flattening is necessary based on the determination and a step of additionally depositing the vapor phase synthetic single crystal diamond without flattening the seed substrate for which the flattening is not necessary based on the determination.

3 Claims, 1 Drawing Sheet

(51) Int. Cl.
  *C30B 29/04* (2006.01)
  *C30B 25/10* (2006.01)
  *C30B 25/12* (2006.01)
(52) U.S. Cl.
  CPC .......... *C30B 25/183* (2013.01); *C30B 25/186* (2013.01); *C30B 29/04* (2013.01)

(56) References Cited

U.S. PATENT DOCUMENTS

| | | | | |
|---|---|---|---|---|
| 5,587,013 A | * | 12/1996 | Ikegaya | B24B 9/16 117/104 |
| 6,132,816 A | * | 10/2000 | Takeuchi | C23C 16/274 427/249.8 |
| 2006/0130767 A1 | * | 6/2006 | Herchen | G03B 27/32 118/728 |
| 2008/0170981 A1 | | 7/2008 | Genis et al. | |

FOREIGN PATENT DOCUMENTS

| | | |
|---|---|---|
| EP | 0 989 211 A1 | 3/2000 |
| GB | 2497665 A | 6/2013 |
| WO | WO 2006/100559 A1 | 9/2006 |
| WO | WO 2012/084655 A2 | 6/2012 |

OTHER PUBLICATIONS

Feng, et. al., "Surface stress measurement with interference microscopy of thick homoepitaxial single-crystal diamond layers," Diamond and Related Materials, Elsevier Science Publishers, Amsterdam, NL, vol. 19, No. 12, Dec. 1, 2010, pp. 1453-1456, XP027533161, ISSN: 0925-9635.

Mokuno, et. al., "Synthesizing single-crystal diamond by repetition of high rate homoepitaxial growth by microwave plasma CVD," Diamond and Related Materials, Elsevier Science Publishers, Amsterdam, NL, vol. 14, No. 11-12, Nov. 1, 2005, pp. 1743-1746, XP027813468, ISSN: 0925-9635.

Extended European Search Report issued in Application No. 14003205.3 dated Oct. 31, 2014.

Y. Shintani, "Growth of Highly (111)-oriented, Highly Coalesced Diamond Films on Platinum (111) surface: A Possibility of Heteroepitaxy," *Journal of Materials Research*, vol. 11, (1996), pp. 2955-2956.

K. Ohtsuka et al., "Epitaxial Growth of Diamond on Iridium," *Japanese Journal of Applied Physics*, vol. 35, (1996), pp. L1072-L1074.

* cited by examiner

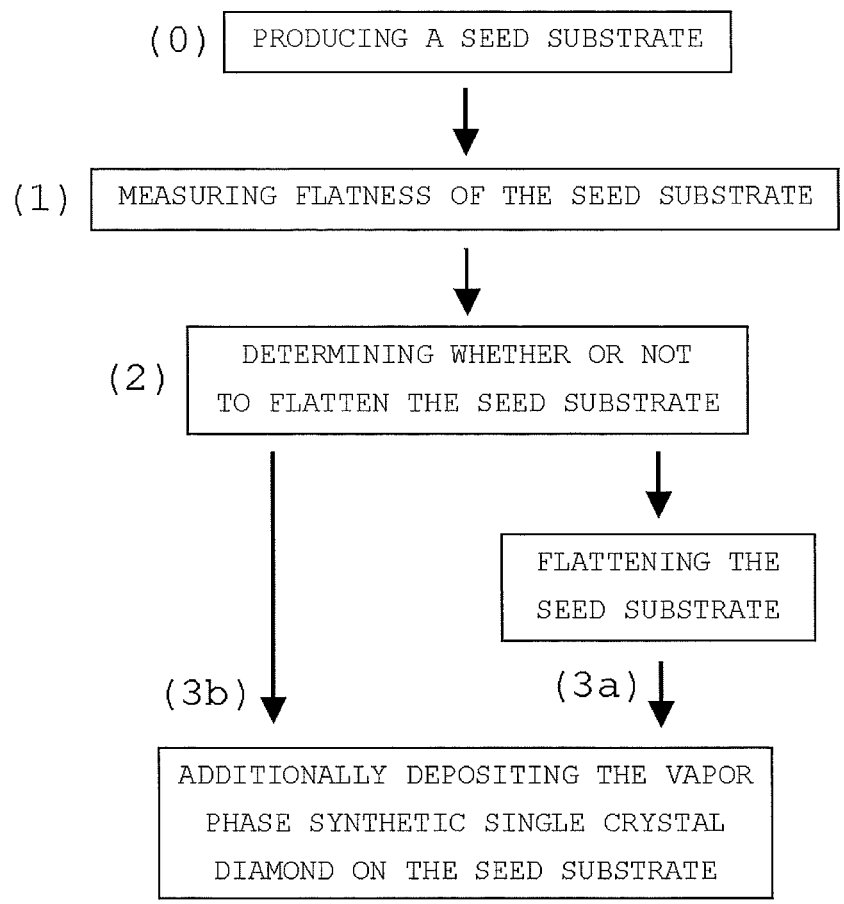

METHOD FOR MANUFACTURING A SINGLE CRYSTAL DIAMOND

BACKGROUND OF THE INVENTION

Field of the Invention

The present invention relates to a method for manufacturing a single crystal diamond.

Description of the Related Art

Diamond has a wide band gap of 5.47 eV and has extremely high dielectric breakdown electric field strength of 10 MV/cm. Further, as diamond has the highest thermal conductivity among materials, if used in an electronic device, it is possible to advantageously realize a high-power electronic device.

Further, diamond which has high drift mobility can be the most advantageously used as a high speed electronic device among semiconductors in terms of Johnson performance index. Diamond is thus said to be an ultimate semiconductor suitable for use in high frequency and high power electronic devices.

Currently, most of single crystal diamond for producing a diamond semiconductor is diamond referred to as Ib type diamond which is synthesized using a high-pressure method. This Ib type diamond contains a number of nitrogen impurities and can be manufactured in a size of only approximately 5 mm square, and therefore has less practicability.

In contrast, a CVD (Chemical Vapor Deposition) method can provide large-area poly crystal diamond having a diameter of approximately 6 inches with high purity. However, it is difficult to produce single crystal diamond which is generally suitable for use in electronic devices because conventionally, a single crystal Si substrate is used as a base substrate, which makes it extremely difficult to cause heteroepitaxial growth due to a great difference in a lattice constant between the substrate and the diamond (a degree of lattice mismatching of 52.6%).

Therefore, various studies have been conducted, and it has been reported that a method is effective in which a Pt (see Non-Patent Document 1) or Ir (see Non-Patent Document 2) film is formed on a base substrate as a foundation film and a film of diamond is formed thereon.

Currently, studies of an Ir film have been particularly proceeding, and in this method, the Ir film is heteroepitaxially grown on the base substrate such as MgO and Si. Further, it has been proposed to put a buffer layer between the Ir film and the base substrate as necessary. Still further, a method in which diamond is grown after ion irradiation pretreatment is performed by a DC plasma CVD method using hydrogen-diluted methane gas, enables manufacturing of diamond, which had initially been submicron-size diamond, but, currently, enables manufacturing of diamond with a size of several millimeters.

PRIOR ART DOCUMENTS

Non-Patent Documents

Non-Patent Document 1: J. Mater. Res. Vol. 11 (1996), pp. 2955 and 2956
Non-Patent Document 2: Jpn. J. Appl. Phys. Vol. 35 (1996), pp. L1072 to L1074

SUMMARY OF THE INVENTION

With the above-described method for manufacturing a single crystal diamond using the foundation film through the CVD method, a large difference in linear expansion coefficients occurs between the base substrate, the foundation film, and further diamond. For example, linear expansion coefficients of an MgO substrate, the Ir film and diamond are respectively $13.8 \times 10^{-6} K^{-1}$, $7.1 \times 10^{-6} K^{-1}$ and $1.1 \times 10^{-6} K^{-1}$, which may produce a large convex shaped warpage in a substrate after diamond is grown even if the diamond has a small thickness. This may cause damage in single crystal diamond, which becomes a problem in practical use.

To address the problem, a method is effective in which after a thin diamond layer is grown on a base substrate on which a foundation film is formed (i.e. a foundation substrate), the diamond layer is separated from the diamond layer/the foundation substrate to obtain a thin freestanding diamond substrate, and diamond is additionally deposited using this thin freestanding diamond substrate as a single crystal diamond seed substrate to make thicker diamond.

However, there is a case where such a seed substrate has a large warpage according to production conditions. If additional deposition is performed on such a seed substrate having a large warpage (i.e. with low flatness) using a method such as a microwave CVD method and a DC plasma CVD method, a gap occurs between the seed substrate and a stage on which the seed substrate is placed. This gap may partially increase a temperature of the seed substrate and cause degradation of quality of single crystal diamond. Particularly, this degradation is prominent under the conditions of high power, high carbon concentration, high pressure, and the like, which increase deposition speed.

The present invention has been made in view of these problems, and it is an object of the present invention to provide a method for manufacturing a single crystal diamond with high quality by stably and additionally depositing vapor phase synthetic single crystal diamond on a single crystal diamond seed substrate obtained by vapor phase synthesis.

In order to solve the above problems, the present invention provides a method for manufacturing a single crystal diamond in which a single crystal diamond seed substrate obtained by vapor phase synthesis is placed on a stage and vapor phase synthetic single crystal diamond is additionally deposited thereon, the method comprising:

(1) a step of measuring flatness of the single crystal diamond seed substrate prior to additional deposition of the vapor phase synthetic single crystal diamond;

(2) a step of determining whether or not to flatten the single crystal diamond seed substrate based on the measurement result of the flatness; and (3) any one of the following two steps of:

(3a) a step of additionally depositing the vapor phase synthetic single crystal diamond after flattening the single crystal diamond seed substrate for which the flattening is necessary based on the determination; and (3b) a step of additionally depositing the vapor phase synthetic single crystal diamond without flattening the single crystal diamond seed substrate for which the flattening is not necessary based on the determination.

According to this method for manufacturing a single crystal diamond, additional deposition is stably performed in a state where the seed substrate is sufficiently brought into contact with the stage by using a single crystal diamond seed substrate with high flatness or by flattening a seed substrate with low flatness, it is possible to provide a single crystal diamond with high quality.

Further, at this time, in the step (3a), according to the flatness of the single crystal diamond seed substrate, the single crystal diamond seed substrate may be flattened by forming a flattening layer on a surface or a rear surface of the single crystal diamond seed substrate, wherein the flattening layer is formed by depositing vapor phase synthetic single crystal diamond at low power conditions.

By this means, even on a single crystal diamond seed substrate with low flatness, it is possible to perform additional deposition stably in a state where the seed substrate is sufficiently brought into contact with the stage by forming a flattening layer, so that it is possible to provide a single crystal diamond with high quality.

Further, at this time, in the step (3a), according to the flatness of the single crystal diamond seed substrate, the single crystal diamond seed substrate is placed on the stage, a pressure is reduced from an adsorption hole formed on the stage to thereby make the single crystal diamond seed substrate adsorbed on the stage by a difference between a gas pressure inside a chamber and a reduced gas pressure inside the adsorption hole of the stage, and thereby, the single crystal diamond seed substrate may be flattened.

By this means, even on a single crystal diamond seed substrate with low flatness, it is possible to perform additional deposition stably in a state where the seed substrate is sufficiently brought into contact with the stage by flattening the seed substrate by making the seed substrate adsorbed on the stage, so that it is possible to provide a single crystal diamond with high quality.

Further, in the determination of the step (2), the single crystal diamond seed substrate with the measured flatness greater than 20 μm may be determined as a single crystal diamond seed substrate for which the flattening is necessary, while the single crystal diamond seed substrate with the measured flatness of 20 μm or less may be determined as a single crystal diamond seed substrate for which the flattening is not necessary.

By setting a criterion for determining whether or not to flatten the single crystal diamond seed substrate as described above, it is possible to perform additional deposition on a seed substrate with higher flatness, so that it is possible to provide a single crystal diamond with high quality more reliably.

As described above, according to the method for manufacturing a single crystal diamond of the present invention, by using a single crystal diamond seed substrate with high flatness or by flattening a seed substrate with low flatness, it is possible to perform additional deposition stably in a state where the seed substrate is sufficiently brought into contact with the stage, so that it is possible to provide a single crystal diamond with high quality. Further, the single crystal diamond manufactured by the method of the present invention is extremely useful in producing an electric device which is put into practical use, in terms of crystallinity and the size. Accordingly, if such single crystal diamond is used as a substrate for an electric device such as an LED and a power device, it is possible to sufficiently provide desired characteristics.

BRIEF DESCRIPTION OF THE DRAWING

FIG. 1 is a flowchart illustrating an example of a method for manufacturing a single crystal diamond of the present invention.

DETAILED DESCRIPTION OF THE PREFERRED EMBODIMENTS

Embodiments of the present invention will be described below, though the present invention is not limited to these embodiments.

The inventors of the present invention found that in order to stably and additionally deposit vapor phase synthetic diamond on a thin single crystal diamond seed substrate obtained by vapor phase synthesis, it is necessary to sufficiently bring the seed substrate into contact with a stage of a CVD apparatus, and it is possible to perform additional deposition stably in a state where the seed substrate is sufficiently brought into contact with the stage if the seed substrate has high flatness, and thus have accomplished the present invention.

Further, the inventors of the present invention found that even with a seed substrate with low flatness, by flattening the seed substrate by forming a flattening layer at a low deposition speed on a surface or a rear surface of the seed substrate, or by flattening the seed substrate by reducing a pressure and making the seed substrate adsorbed from an adsorption hole formed on a stage to correct the seed substrate forcibly, it is possible to sufficiently bring the seed substrate into contact with the stage.

The present invention provides a method for manufacturing a single crystal diamond in which a single crystal diamond seed substrate obtained by vapor phase synthesis is placed on a stage and vapor phase synthetic single crystal diamond is additionally deposited thereon, the method comprising:

(1) a step of measuring flatness of the single crystal diamond seed substrate prior to additional deposition of the vapor phase synthetic single crystal diamond;

(2) a step of determining whether or not to flatten the single crystal diamond seed substrate based on the measurement result of the flatness; and (3) any one of the following two steps of:

(3a) a step of additionally depositing the vapor phase synthetic single crystal diamond after flattening the single crystal diamond seed substrate for which the flattening is necessary based on the determination; and (3b) a step of additionally depositing the vapor phase synthetic single crystal diamond without flattening the single crystal diamond seed substrate for which the flattening is not necessary based on the determination.

The method for manufacturing a single crystal diamond of the present invention can be performed, for example, along the flow illustrated in the flowchart of FIG. 1.

A single crystal diamond seed substrate used in the present invention can be obtained by, for example, forming a foundation film on a base substrate through a sputtering method, or the like, and after performing pretreatment for forming a diamond nucleus on the base substrate on which the foundation film is formed, heteroepitaxilly growing diamond through a CVD method, and separating the diamond layer through an etching method, or the like (FIG. 1 (0)).

In this case, as the base substrate, for example, an MgO substrate or a Si substrate can be used.

Further, as the foundation film, for example, an Ir film or a Pt film can be used.

The foundation film can be formed, for example, using Ir as a raw material through a radio frequency magnetron sputtering method of 13.56 MHz under the conditions of power of 1,000 W in an Ar gas atmosphere and a pressure inside a chamber of $5 \times 10^{-2}$ Torr.

Further, for example, hydrogen-diluted methane can be used as a source gas for performing the pretreatment for forming a diamond nucleus. Specifically, a diamond nucleus can be formed by applying a negative voltage to an electrode at a substrate side using a bias method under the conditions of hydrogen-diluted methane (volume of $CH_4$)/{volume of (CH$_4$+H$_2$)}=5.0 vol. % and a pressure inside a chamber of 100 Torr so as to expose the base substrate to plasma for 90 seconds.

Further, for example, hydrogen-diluted methane can be used as a source gas for heteroepitaxially growing diamond on the base substrate on which the foundation film is formed. Specifically, a diamond layer can be formed by performing deposition using a microwave CVD method of 2.45 GHz under the conditions of power of 4,000 W, hydrogen diluted methane of 5.0 vol. % and a pressure inside a chamber of 110 Torr.

In separation of the diamond layer from the foundation film/the base substrate, for example, immersing them into a wet etching liquid such as a phosphoric acid solution and a thermal mixed acid and after separating the diamond layer/the foundation film from the base substrate, removing the remained foundation film using a mechanical polishing method; thereby a single crystal diamond seed substrate can be obtained. Further, it is also possible to remove the foundation film/the base substrate at once using the mechanical polishing method without immersing them into the wet etching liquid.

The flatness of the single crystal diamond seed substrate obtained using the vapor phase synthesis method as described above is measured (FIG. 1 (1)). The measurement of the flatness in the step (1) can be performed, for example, using a probe type warpage measuring device, a laser-spectroscopic interference type warpage measuring device, a laser oblique incidence interference type warpage measuring device, or the like.

Next, whether or not to flatten the seed substrate is determined based on the flatness of the seed substrate measured in the step (1) (FIG. 1 (2)). At this time, a seed substrate having the flatness of greater than 20 μm measured in step (1) can be determined as a single crystal diamond seed substrate for which flattening is necessary, while a seed substrate having the flatness of 20 μm or less measured in the step (1) can be determined as a single crystal diamond seed substrate for which flattening is not necessary. Of course, a criterion is not limited to this, and may be determined according to the specification of a desired diamond substrate as a product and the flatness of the stage on which the seed substrate is placed.

When it is determined that flattening is necessary, in the step (3a), according to the flatness of the single crystal diamond seed substrate, the single crystal diamond seed substrate can be flattened by forming a flattening layer on a surface or a rear surface of the single crystal diamond seed substrate by depositing vapor phase synthetic single crystal diamond at low power conditions.

By this means, even if the seed substrate has low flatness, by forming the flattening layer, it is possible to perform additional deposition stably in a state where the seed substrate is sufficiently brought into contact with the stage. Further, the flattening layer can be formed by performing deposition, for example, using hydrogen-diluted methane as a source gas, through a microwave CVD method of 2.45 GHz under the conditions of power of 1,000 W, hydrogen-diluted methane of 6.0 vol. % and a pressure inside the chamber of 110 Torr.

Further, in the step (3a), according to the flatness of the single crystal diamond seed substrate, the single crystal diamond seed substrate is placed on the stage, a pressure is reduced from an adsorption hole formed on the stage to thereby make the single crystal diamond seed substrate adsorbed on the stage by a difference between a gas pressure inside a chamber and a reduced gas pressure inside the adsorption hole of the stage, so that it is possible to forcibly correct the single crystal diamond seed substrate and perform flattening.

By this means, even if the seed substrate has low flatness, by making the seed substrate adsorbed on the stage, it is possible to perform additional deposition stably in a state where the seed substrate is sufficiently brought into contact with the stage.

Further, in the step (3a), flatness may be measured again after the seed substrate is flattened. If necessary, the seed substrate may be flattened again. By this means, it is possible to perform additional deposition of the single crystal diamond more reliably using the flattened seed substrate. It should be noted that in the flattening of the seed substrate, in order to obtain a further flatter seed substrate, additional deposition may be performed in a state where the seed substrate on which the flattening layer is formed is adsorbed on the stage.

Further, in the additional deposition in the steps (3a) and (3b), additional deposition is performed, for example, using hydrogen-diluted methane as a source gas through a microwave CVD method of 2.45 GHz, under the conditions of power of 4,000 W, hydrogen-diluted methane of 5.0 vol. %, and the pressure inside the chamber of 110 Torr, so that it is possible to manufacture single crystal diamond.

As described above, according to the method for manufacturing a single crystal diamond of the present invention, by using a single crystal diamond seed substrate with high flatness or by flattening a seed substrate with low flatness, additional deposition can be performed stably in a state where the seed substrate is sufficiently brought into contact with the stage, so that it is possible to provide a single crystal diamond with high quality. Further, the single crystal diamond manufactured by the method of the present invention is extremely useful in producing an electronic device which is put into practical use, in terms of crystallinity and the size. Accordingly, if such single crystal diamond is used as a substrate for an electronic device such as an LED and a power device, it is possible to sufficiently provide desired characteristics.

EXAMPLES

The present invention will be specifically described below using examples of the present invention and a comparative example, though the present invention is not limited to these examples.

Example 1

Single crystal MgO with the both sides being polished, which is a 10.0 mm square crystal having a thickness of 1.0 mm and orientation (100), was prepared as a base substrate, and Ir was heteroepitaxially grown on a surface on which a diamond film is to be formed to form a foundation film. A radio frequency magnetron sputtering method of 13.56 MHz was used for forming the foundation film, targeting at Ir having a diameter of 6 inches, a thickness of 5 mm and purity of 99.9% or higher. The MgO substrate was heated to 800° C., and after it was confirmed that a base pressure became 6×10$^{-7}$ Torr or lower, 10 sccm of an Ar gas was introduced. After the base pressure became 5×10$^{-2}$ Torr by adjusting aperture of a valve which is connected to an exhaust system, film formation was performed for 15 minutes by inputting radio frequency power of 1,000 W. The obtained Ir film had a thickness of 0.7 μm.

Next, the MgO substrate on which the Ir film was formed was set on an electrode which is a 14 mm square flat plate, and after it was confirmed that the base pressure became $1 \times 10^{-6}$ Torr or lower, 500 sccm of hydrogen-diluted methane of 5.0 vol. % was introduced as a source gas. After the base pressure became 100 Torr by adjusting the aperture of the valve which is connected to the exhaust system, a negative voltage was applied to an electrode at a substrate side to expose the substrate to plasma for 90 seconds, and thereby a diamond nucleus was formed on a surface of the MgO substrate on which the Ir film was formed.

Next, diamond was heteroepitaxially grown using a microwave CVD method of 2.45 GHz. The substrate was set inside a chamber of a microwave CVD apparatus, and after exhausting was performed using a rotary pump until the base pressure became $10^{-3}$ Torr or lower, 1,000 sccm of hydrogen-diluted methane of 5.0 vol. % was introduced as a source gas. After the base pressure inside the chamber became 110 Torr by adjusting aperture of the valve which is connected to the exhaust system, film formation was performed for 10 hours by inputting a microwave with power of 4,000 W. A temperature of the substrate during film formation, which was measured by a pyrometer, was 900° C.

The obtained diamond layer was a 10 mm square complete continuous film which did not have delamination on the whole surface of the substrate, and had a thickness of 50 µm and flatness of 60 µm. The Ir film/the MgO substrate were removed using an etching method to obtain a single crystal diamond seed substrate having flatness of 20 µm and having a freestanding structure. Because the flatness was 20 µm, it was determined that flattening was not necessary for this seed substrate.

This seed substrate was placed on the stage and additional deposition was performed using the microwave CVD method again under the same conditions as those upon deposition of the above-described diamond layer except that the film formation was performed for 50 hours, and thereby a single crystal diamond having a total thickness of 300 µm was obtained.

This single crystal diamond turned out to be a homoepitaxial diamond through SEM observation and X-ray diffraction (θ-2θ, pole figure). Further, as a result of evaluating this single crystal diamond through Raman spectroscopic analysis, it was confirmed that the single crystal diamond was a high-purity diamond which did not contain non-diamond components.

Example 2

The same operation as that of Example 1 was performed except that the film formation was performed for 15 hours using the microwave CVD method in the deposition of the diamond layer for producing the seed substrate, and thereby a diamond layer having a thickness of 75 µm and flatness of 90 µm was obtained. The Ir film/the MgO substrate were removed using the etching method to obtain a single crystal diamond seed substrate having flatness of 60 µm and having a freestanding structure. Because the flatness was 60 µm, it was determined that flattening was necessary for this seed substrate.

In order to flatten this seed substrate, deposition was performed for 5 hours on the rear surface of the seed substrate using the microwave CVD method under the conditions of power of 1,000 W, hydrogen-diluted methane of 6.0 vol. % and the pressure inside the chamber of 110 Torr to form a flattening layer, and the seed substrate having a thickness of 80 µm and flatness of 20 µm was obtained.

This seed substrate was placed on the stage and additional deposition was performed using the microwave CVD method again under the same conditions as those upon additional deposition to the seed substrate in Example 1 except that the film formation was performed for 44 hours, and thereby a single crystal diamond having a total thickness of 300 µm was obtained.

This single crystal diamond turned out to be a homoepitaxial diamond through SEM observation and X-ray diffraction (θ-2θ, pole figure). Further, as a result of evaluating this single crystal diamond through Raman spectroscopic analysis, it was confirmed that the single crystal diamond was a high-purity diamond which did not contain non-diamond components.

Example 3

The same operation as that of Example 1 was performed except that the film formation was performed for 15 hours using the microwave CVD method in the deposition of the diamond layer for producing the seed substrate, and thereby a diamond layer having a thickness of 75 µm and flatness of 90 µm was obtained. The Ir film/the MgO substrate were removed using the etching method to obtain a single crystal diamond seed substrate having flatness of 60 µm and having a freestanding structure. Because the flatness was 60 µm, it was determined that flattening was necessary for this seed substrate.

In order to flatten this seed substrate, the seed substrate was placed on the stage of the CVD apparatus, a pressure is reduced from an adsorption hole formed on the stage to make the seed substrate adsorbed on the stage. It was confirmed that the flatness of the seed substrate upon adsorption was 20 µm or less.

Additional deposition was performed on this seed substrate using the microwave CVD method again while the above-described adsorption was performed under the same conditions as those upon additional deposition to the seed substrate in Example 1 except that the film formation was performed for 45 hours, and thereby a single crystal diamond having a total thickness of 300 µm was obtained.

This single crystal diamond turned out to be a homoepitaxial diamond through SEM observation and X-ray diffraction (θ-2θ, pole figure). Further, as a result of evaluating this single crystal diamond through Raman spectroscopic analysis, it was confirmed that the single crystal diamond was a high-purity diamond which did not contain non-diamond components.

Comparative Example

The same operation as that of Example 1 was performed except that the film formation was performed for 15 hours using the microwave CVD method in the deposition of the diamond layer for producing the seed substrate, and thereby a diamond layer was obtained. The thickness and the flatness which were measured for comparison with the Examples were respectively 75 µm and 90 µm. Next, when the Ir film/the MgO substrate were removed using the etching method, the obtained single crystal diamond seed substrate had flatness of 60 µm, which was measured again for comparison, and had a freestanding structure.

When additional deposition was performed on this seed substrate under the same conditions as those upon additional deposition to the seed substrate in Example 1 without performing determination as to whether or not to flatten the seed substrate, a temperature of the substrate increased mainly around a part where the seed substrate did not contact with the stage, and a diamond having minute crystal grains was deposited instead of single crystal diamond.

As described above, in Example 1 in which additional deposition was performed using a seed substrate with high flatness, Example 2 in which additional deposition was performed after a seed substrate was flattened by forming a flattening layer on the seed substrate with low flatness, and Example 3 in which additional deposition was performed after a seed substrate was flattened by making the seed substrate with low flatness adsorbed on the stage, by performing additional deposition stably in a state where the seed substrate was sufficiently brought into contact with the stage, single crystal diamond with high quality could be obtained.

In contrast, in the comparative example in which additional deposition was directly performed without performing determination as to whether or not to flatten the seed substrate with low flatness, the temperature of the substrate increased mainly around a part where the seed substrate did not contact with the stage, and single crystal diamond could not be obtained.

It becomes clear from the above that, according to the method for manufacturing a single crystal diamond of the present invention, by using a single crystal diamond seed substrate with high flatness or by flattening a seed substrate with low flatness, additional deposition can be stably performed in a state where the seed substrate is sufficiently brought into contact with a stage, so that it is possible to provide a single crystal diamond with high quality.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

What is claimed is:

1. A method for manufacturing a single crystal diamond in which a single crystal diamond seed substrate obtained by vapor phase synthesis is placed on a stage and vapor phase synthetic single crystal diamond is additionally deposited thereon, the method comprising:
   a step of flattening a single crystal diamond seed substrate having a flatness greater than 20 μm by forming a flattening layer on a surface or a rear surface of the single crystal diamond seed substrate, wherein the flattening layer is formed by depositing vapor phase synthetic single crystal diamond at a certain power to produce a single crystal diamond seed substrate having a flatness of 20 μm or less, and
   a step of additionally depositing the vapor phase synthetic single crystal diamond on the single crystal diamond seed substrate having the flatness of 20 μm or less at a power higher than the certain power when forming the flattening layer.

2. The method for manufacturing a single crystal diamond according to claim 1, wherein the single crystal diamond seed substrate is placed on the stage, a pressure is reduced from an adsorption hole formed on the stage to thereby make the single crystal diamond seed substrate adsorbed on the stage by a difference between a gas pressure inside a chamber and a reduced gas pressure inside the adsorption hole of the stage, and thereby, the single crystal diamond seed substrate is flattened.

3. The method for manufacturing a single crystal diamond according to claim 1, wherein the power for forming the flattening layer is 1,000 W.

* * * * *